United States Patent [19]

Kameyama et al.

[11] Patent Number: 5,077,227
[45] Date of Patent: Dec. 31, 1991

[54] SEMICONDUCTOR DEVICE AND METHOD FOR FABRICATING THE SAME

[75] Inventors: Shuichi Kameyama, Itami; Tadao Komeda, Ikoma, both of Japan

[73] Assignee: Matsushita Electric Industrial Co., Ltd., Osaka, Japan

[21] Appl. No.: 564,701

[22] Filed: Aug. 8, 1990

Related U.S. Application Data

[60] Division of Ser. No. 393,112, Aug. 4, 1989, abandoned, which is a continuation of Ser. No. 55,334, May 28, 1987, abandoned.

[30] Foreign Application Priority Data

Jun. 3, 1986 [JP] Japan .................................. 61-128614
Jun. 12, 1986 [JP] Japan .................................. 61-136547

[51] Int. Cl.$^5$ ..................... H01L 21/265; H01L 29/73
[52] U.S. Cl. ........................................ 437/31; 357/34; 437/29; 437/90
[58] Field of Search ............... 357/34, 55, 58; 437/31, 437/29, 32

[56] References Cited

U.S. PATENT DOCUMENTS 4,495,512 1/1985 Isaac et al. ............................ 357/34
4,583,106 4/1986 Anantha et al. ....................... 357/35

FOREIGN PATENT DOCUMENTS

| 0004292 | 10/1979 | European Pat. Off. | ............. 357/34 |
|---|---|---|---|
| 0153686 | 9/1985 | European Pat. Off. | ............. 357/34 |
| 0170250 | 2/1986 | European Pat. Off. | ............. 357/34 |
| 56-135964 | 10/1981 | Japan | .................................. 357/34 |
| 56-153766 | 11/1981 | Japan | .................................. 357/34 |
| 58-169971 | 10/1983 | Japan | .................................. 357/34 |
| 61-7664 | 1/1986 | Japan | .................................. 357/34 |

OTHER PUBLICATIONS

Barson, "Improved NPN Process and Structure", IBM Technical Disclosure Bulletin, vol. 23, No. 9, Feb. 1981.

*Primary Examiner*—Olik Chaudhuri
*Assistant Examiner*—Long Pham
*Attorney, Agent, or Firm*—Wenderoth, Lind & Ponack

[57] ABSTRACT

Disclosed is a structure of a semiconductor integrated circuit such as bipolar transistor, along with the fabrication thereof, in which an active device region such an intrinsic base is formed from, at least, the bottom of the groove formed in a semiconductor substrate, and this active device region and a low resistance electrode take-out region such an extrinsic base formed around the groove are connected favorably with each other.

7 Claims, 12 Drawing Sheets

SEMICONDUCTOR DEVICE AND METHOD FOR FABRICATING THE SAME

This application is a division of now abandoned application Ser. No. 07/393,112 filed on Aug. 4, 1989, which is a continuation of now abandoned application Ser. No. 07/055,334, filed on May 28, 1987.

BACKGROUND OF THE INVENTION

This invention relates to a semiconductor device and a method of fabrication of the same, and more particularly to the structure and fabricating method of a transistor device suited to a high speed and high integration trend of semiconductor integrated circuit such as bipolar types.

In the field of recent bipolar integrated circuits, various new technologies have been proposed for the improvement of the switching speed of the transistor. Principal improving methods employing such technologies may include (i) a method of shortening the electron transit time in the base by forming the internal base of a vertical NPN transistor in a small thickness in the depthwise direction of the base, and (ii) a method of lowering the resistance of a parasitic base so as to decrease the delay time due to coupling of the parasitic base resistance inserted in series to the intrinsic base and the base input capacitance. As the method of lowering the resistance of the parasitic base, the parasitic base region for taking out the electrode is formed by diffusion of impurities of higher concentration than in the intrinsic base, and it is used as extrinsic base, which is known generally as the graft base method. For example, in the International Electron Device Meeting Digest of Technical Papers, 1984, pp. 753-756, a structure is disclosed of the formation of a vertical NPN transistor, in which the extrinsic base formed beneath a thermal oxidation film and the intrinsic base formed from the opening of the thermal oxidation film are connected with each other in the vicinity of the end portion of the thermal oxidation film. For example, in the structure of a vertical NPN transistor shown in FIG. 8, an n-type buried layer 210 and an n-type epitaxial layer 212 are formed on a p-type semiconductor layer 200, and a depletion layer 222 is formed on the epitaxial layer 212. In conjunction with p-type extrinsic bases 220A, 220B are formed p-type regions 240A, 240B, 240C, which become thin intrinsic bases, being made up by boron ion injection from the opening of silicon oxide films 230A, 230B, and an n-type region 260, which becomes an emitter. Here, supposing the specific resistance of the n-type epitaxial layer to be about 1 $\Omega$-cm, the depth A of the extrinsic base from the principal plane of epitaxial layer to be about 0.6 $\mu$, the depth B of intrinsic base to be about 0.2 $\mu$, the depth C of emitter to be about 0.1 $\mu$, the length D of depletion layer to be about 1 $\mu$, the opening width between silicon oxide films 230A, 230B formed by selective oxidation to be about 1 $\mu$, and the lateral diffusion length of p-type regions 230A, 230B formed by diffusion immediately before selective oxidation to be about 0.6 82 , the effective width X of the intrinsic base region 240B not canceled by the lateral diffusion of the extrinsic bases 230A, 230B is very narrow, about 0.2 $\mu$, and the length Y of the depletion layer immediately beneath the intrinsic base is about 1.2 $\mu$, that is, 0.2 $\mu$ longer.

Figure 8:
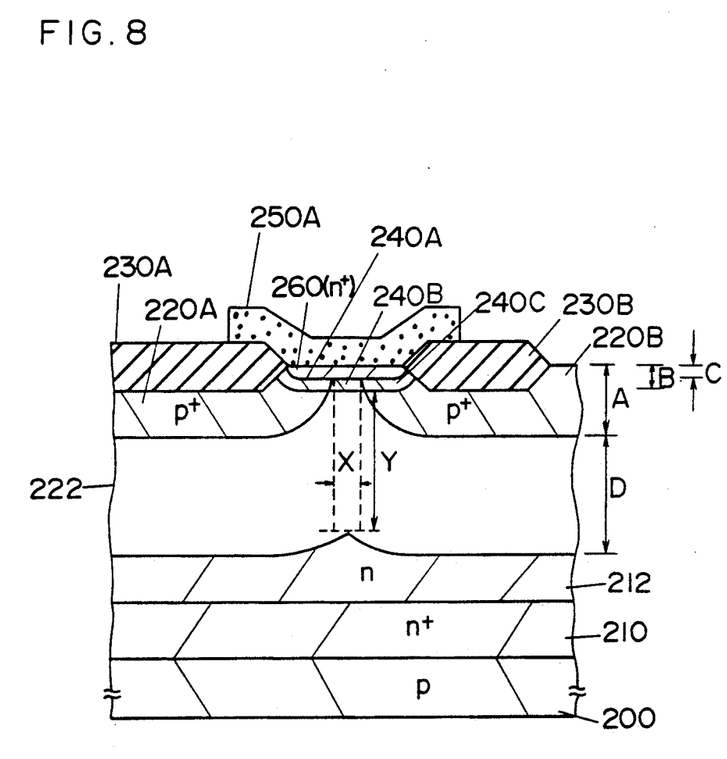
FIGS. 8 and 9A and 9B are sectional views showing the structure of a conventional NPN transistor to explain the conventional problems.

As shown in FIG. 8, the width X of the intrinsic base region 240B which becomes the collector current passage of the vertical NPN transistor is about 0.2 $\mu$, that is, 1/5 of about 1.0 $\mu$ of the opening width of the emitter. As a result, the collector current becomes substantially small, and drop of current amplification factor is extreme. On the other hand, the length Y of the depletion layer 222 of the collector right beneath the intrinsic base region becomes about 20% larger, which causes an increase the transit time of electrons in the collector depletion layer. Thus, if it is attempted to form the diffusion regions 220A, 220B high in the impurity concentration by ordinary self-aligned process in order to lower the resistance of the extrinsic base, the switching speed is reduced due to the lack of drive capacity of the collector and the overgrowth of collector-base depletion layer, and it was practically impossible to form a fine emitter suited to the high speed and high integration trend.

Figure 9A:
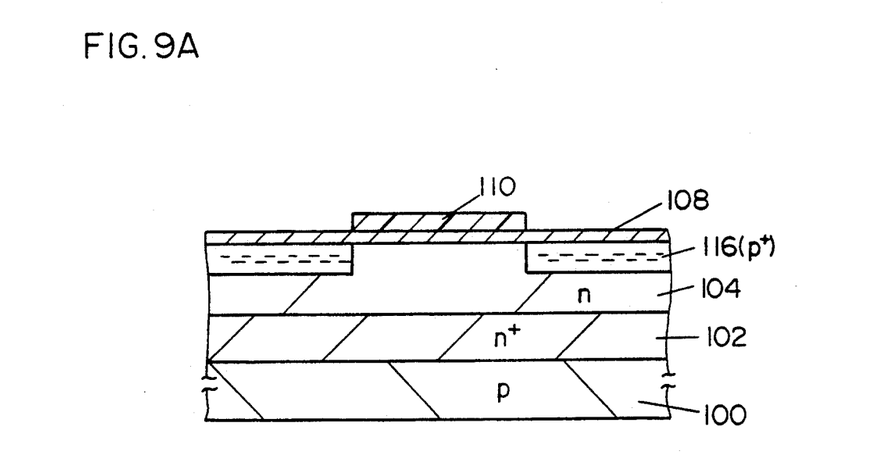
Figure 9B:
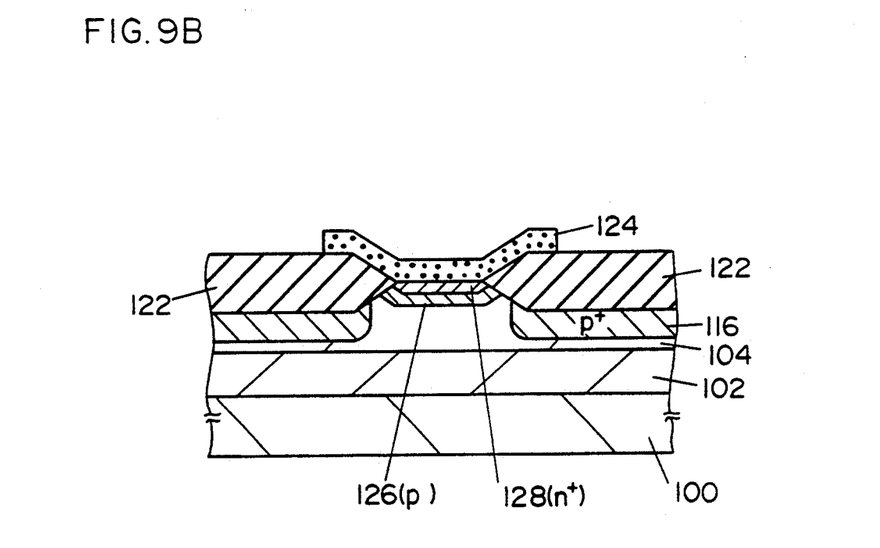

As stated above, when high concentration impurities of the extrinsic base invade into the intrinsic base, problems occur, but different problems are also experienced in a different situation. That is, for the high speed operation of bipolar transistor, shallow an intrinsic base and a low resistance of the extrinsic base must be realized at the same time. As the intrinsic base becomes smaller in depth, the increase of squeeze resistance of the intrinsic base is likely to occur, and in order to reduce this effect, usually, the emitter width is narrowed. In this case, however, if the concentration of impurities in the extrinsic base is raised, the impurity atoms invade into the intrinsic base to modify the profile of the impurities in the intrinsic base, thereby decreasing the current amplification factor in DC and increasing the base transit time of electrons in AC. To suppress these phenomena, no other means are known than to lower the impurity concentration in the extrinsic base and to decrease the diffusion in the lateral direction of the base. According to this method, invasion of the extrinsic base may be controlled, but when the depth of the intrinsic base is made as small as 150 nanometers, the following structural or manufacturing problems occur. That is, since the opening end formed at the beak-shaped end of oxide film fluctuates unstably due to etching during processing, the connection of the intrinsic base and extrinsic base becomes unstable. Or when the connection is poor, since the lateral diffusion of the intrinsic base beneath this beak is small, the effective base width in the lateral direction becomes narrow, so that a punch-through leakage current is likely to occur between the collector and emitter. For example, as shown in FIG. 9 A, an N-type buried layer 102 is formed on a P-type silicon semiconductor substrate 100, and further an N-type epitaxial semiconductor layer 104 is formed, then a thin thermal oxide film 108 of about 20 nanometers in thickness is formed. On this thermal oxide film 108, a silicon nitride film pattern 110 of about 100 nanometers in thickness is formed, and using this pattern 110 as a mask, boron ions are implanted into the epitaxial semiconductor layer 104 at a dose of $2 \times 10^{15}$/cm$^2$, thereby forming a P-type semiconductor region 116 which becomes an extrinsic base. Moreover, as shown in FIG. 9 B, thermal oxidation is effected by using an oxidation resistant silicon nitride film pattern 110 as a mask, and an oxide film 122 of about 250 nanometers in thickness is formed, and after removing the silicon nitride film pattern 110 and oxide film 108 and making an opening for the emitter, a polycrystalline silicon film is deposited on the entire surface, and by patterning it, a polycrystalline silicon film pattern 124 is formed. Next, by implanting boron ions into this polycrystalline silicon film pattern 124 at a dose of $2\times10^{14}/cm^2$, and heating, a P-type semiconductor region 126 is formed having a thickness of about 150 nanometers, which becomes an intrinsic base. Later, similarly, by implanting arsenic ions into this polycrystalline silicon film pattern 124, and by heat treatment, an N-type semiconductor region 128 is formed having a thickness of about 50 nanometers, which becomes an emitter. According to this manufacturing method, the end portion of the oxide film pattern 112 shown in FIG. 9 B is shaped like a bird's beak, and by this end portion shaped like a bird's beak, connection between the extrinsic base 116 and the intrinsic base 126 becomes difficult. In this background, therefore, a novel transistor structure and its manufacturing method to solve the structural and manufacturing problems derived from the instability of connection between extrinsic base and intrinsic base have been desired.

SUMMARY OF THE INVENTION

It is hence a primary object of this invention to present a basic means for solving the problems derived from the two situations relating to the connection of bases and so on.

It is another object of this invention to present a structural and manufacturing means for favorably connecting an active device region such as intrinsic base and a region for taking out the electrode lowered in resistance such as extrinsic base, in an integrated circuit of bipolar transistor or the like.

These and other objects are accomplished by a semiconductor device comprising an opening of an insulation film formed on a semiconductor layer of first conductive type, a first semiconductor region of a second conductive type formed beneath said insulation film, a groove formed in the opening of said insulation film, a second semiconductor region of a second conductive type formed in said groove, and a third semiconductor region of a first conductive type formed in said second semiconductor region of a second conductive type, wherein said first semiconductor region and said second semiconductor region are connected with each other, and a method of fabricating a semiconductor device characterized by a step of forming an opening of insulation film on a semiconductor layer of a first conductive type, a step of forming a first semiconductor region of a second conductive type beneath said insulation film, a step of forming a groove in the opening of said insulation film, a step of forming second semiconductor region of second conductive type, formed in said groove and a step of forming a third semiconductor region of first conductive type in said second semiconductor region of second conductive type, wherein said first semiconductor region and said second semiconductor region are connected with each other.

While the novel features of the invention are set forth in the appended claims, the invention, both as to organization and content, will be better understood and appreciated, along with other objects and features thereof, from the following detailed description taken in conjunction with the drawings.

BRIEF DESCRIPTION OF THE DRAWINGS

FIG. 4 A to F are process sectional drawings showing the manufacturing method of an NPN transistor of a fourth embodiment;

FIG. 5 A to D are process sectional drawings showing the manufacturing method of an NPN transistor of a fifth embodiment;

FIG. 6 A to D are process sectional drawings showing the manufacturing method of an NPN transistor of a sixth embodiment;

FIG. 7 A to D are process sectional drawings showing the manufacturing method of an NPN transistor of a seventh embodiment.

DETAILED DESCRIPTION OF THE INVENTION

Figure 1:
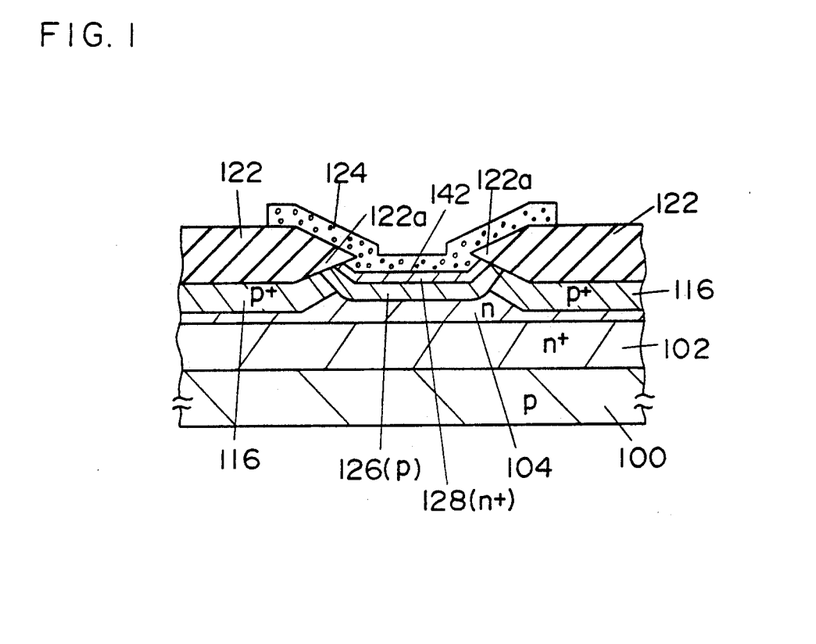
FIG. 1 is a sectional view showing the structure of essential parts of a bipolar NPN transistor in a first embodiment of this invention.

Referring now to FIG. 1, the bipolar NPN transistor in a first embodiment of this invention is described. In this drawing, the parts are the same as the constituent members in FIG. 9 A, B are identified with the same part numbers, and detailed descriptions are omitted.

As shown in FIG. 1, an N-type buried layer 102 and an N-type epitaxial semiconductor layer 104 are formed on a P-type silicon semiconductor substrate 100, and a thermal oxidation film 122 possessing an end portion 122a shaped like a bird's beak is formed on the surface. Beneath the principal part of this oxide film 122 is formed a P-type semiconductor region 116 which becomes an extrinsic base, and a groove 142 is formed in the opening of this oxide film 122, and furthermore a P-type semiconductor region 126 which becomes an intrinsic base is formed in this groove 142. The extrinsic base 116 and the intrinsic base 126 are connected with each other just beneath the bird's beak shaped end portion 122a of the oxide film 122, and a polysilicon electrode 124 is formed in an N-type semiconductor region 128 which becomes an emitter.

As an example of a forming method of such emitter-base junction, when the polysilicon electrode 124 is used as the diffusion source of intrinsic base 126 and emitter 128, a structure excelling in high speed operation with 150-nanometer deep intrinsic base and 50-nanometer deep emitter can be realized. Furthermore, by forming the groove 142, the extrinsic base 116 and intrinsic base 126 may be favorably connected with each other on the side of this groove 142 in a relatively large area, so that punch-through leak current between the collector and emitter and other defects may be prevented, and the connection of bases may be stabilized. Moreover, by the groove 142 formed in the opening of the oxide film 122, the intrinsic base 126 made as deep as the extrinsic base 116 (the bottom of the intrinsic base 126 may be brought closer to the bottom of the extrinsic base 116), so that the N-type epitaxial layer 104 left over between the intrinsic base 126 and the N-type buried layer 102 just beneath it can be made thin. As a result, the collector resistance of the obtained bipolar transistor device may be lowered. Incidentally, in the structure shown in FIG. 1, the side shape of the groove 142 is nearly vertical, but it may be formed in an arbitrary shape as required. For instance, if the beak shaped end portion 122a of the oxide film 122 and the P-type semiconductor region 116 as the extrinsic base are considerably apart from each other, the distance between the intrinsic base 126 and extrinsic base 116 may be shortened by forming the groove 142 by an isotropic etching process so that the side of the groove 142 may be overhung by the beak shaped end portion 122a. Hence, the parasitic base resistance may be lowered, and the stabilization of the control of connection and other advantages are brought about.

Thus, by using the transistor of the first embodiment, the occurrence of punch-through leak current as DC property and increase of switching time due to large a base resistance as AC property may be prevented, and the collector resistance may also be reduced, and the transistor switching time may be further improved.

Figure 2:
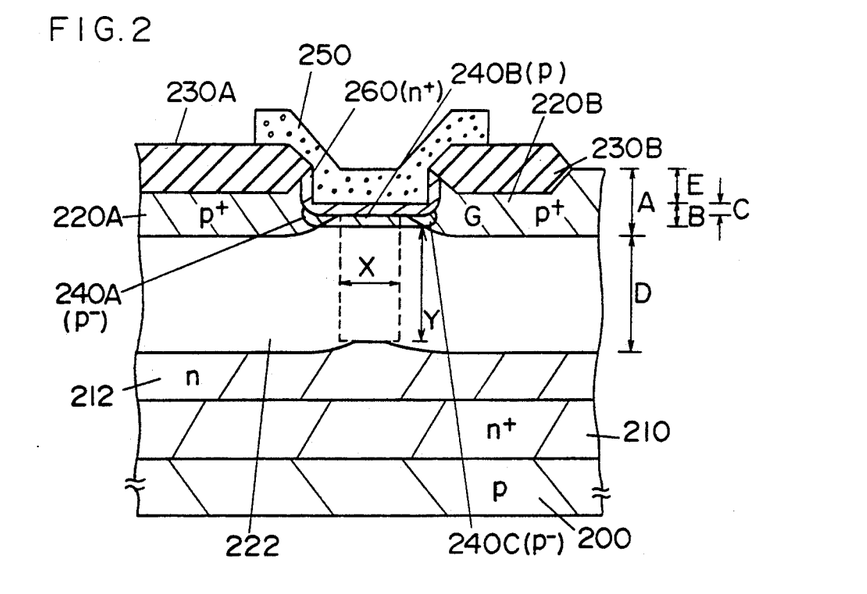
FIG. 2 is a sectional view showing the structure of an NPN transistor of a second embodiment.

As a second embodiment of this invention, a bipolar NPN transistor is described while referring to FIG. 2, in which the same constituent parts as shown in FIG. 8 are identified with the same part numbers and are not explained specifically. The transistor shown in FIG. 2 comprises P-type extrinsic base regions 220A, 220B formed around the device principal portion on an n-type semiconductor substrate 212, in a depth of distance A from the principal plane of the substrate, a groove G formed in said device principal portion, in a depth of distance E from the principal plane of said substrate, P-type intrinsic base regions 240A, 240B, 240C formed in contact with at least said extrinsic base regions 220A, 220B, in a depth of distance B from the bottom of said groove G, and an n-type emitter region 260 formed within a P-type insular region composed of said extrinsic base regions 220A, 220B and said intrinsic base regions 240A, 240B, 240C, wherein the sum of the depth E of groove G and depth B of intrinsic base regions 240A, 240B, 240C is so designed as not to exceed the depth A of extrinsic base regions 220A, 220B.

When applied to the principal portion of the NPN transistor as shown in FIG. 2, each element of the means produced the following actions.

(1) By forming the groove G of depth E, the width X of intrinsic base 240B could be extended to about 0.5 $\mu$, and the drive capacity of the collector current could be increased.

(2) The length of the collector depletion layer 222 just beneath the intrinsic base 240 could be formed in at about 1.0 $\mu$, being nearly equal to the length D of the depletion layer 222 just beneath the extrinsic bases 220A, 220B, and overgrowth of depletion layer was not caused.

(3) By keeping the sum of the depth E of groove G and depth B of the intrinsic base from exceeding depth A of the extrinsic base, the development of the depletion layer 222 just beneath the intrinsic base 240B up to the n-type buried layer 110 could be withheld, so that deterioration of breakdown voltage of the collector-base junction could be prevented.

(4) By preliminarily forming a groove before thermal diffusion of the extrinsic base, the lateral diffusion of the extrinsic base could be sufficiently restricted.

As a third embodiment of this invention, a principal structure of an NPN transistor is described below by referring to the sectional view in FIG. 3.

Figure 3:
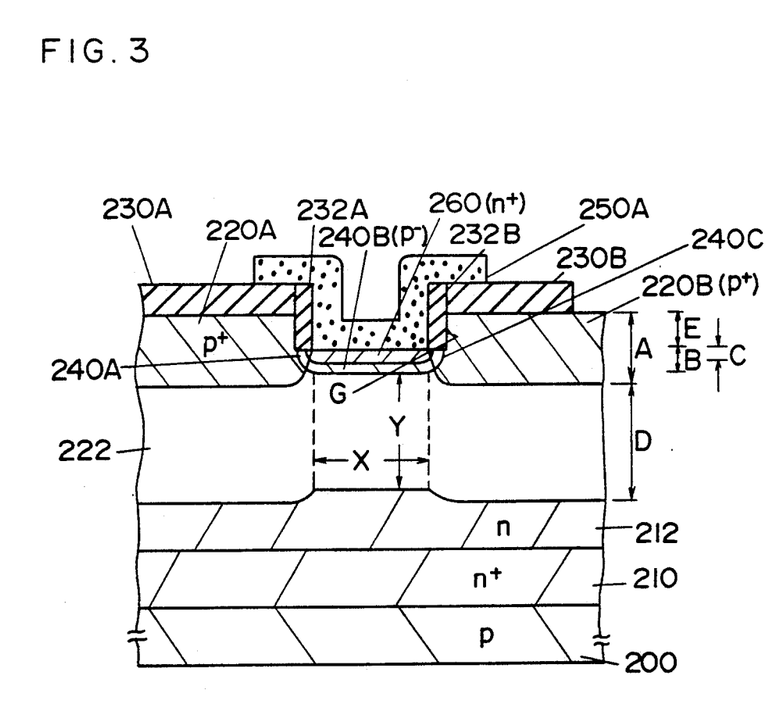
FIG. 3 is a sectional view showing the structure of an NPN transistor of third embodiment.
Figure 4A:
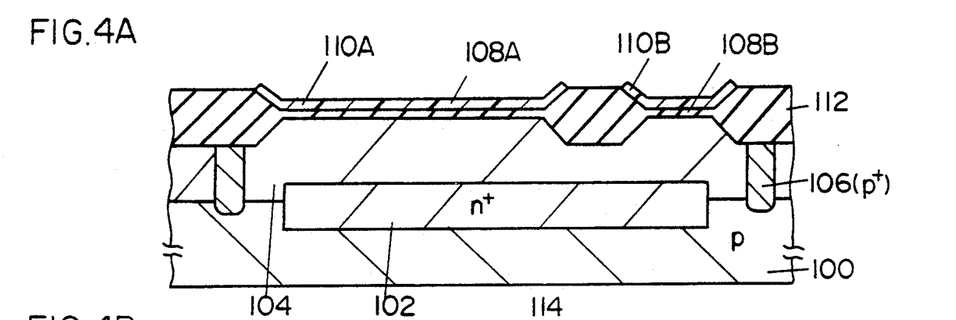
Figure 4B:
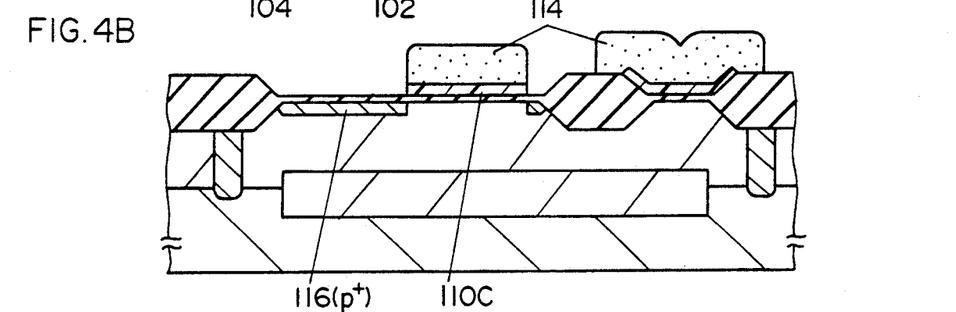
Figure 4C:
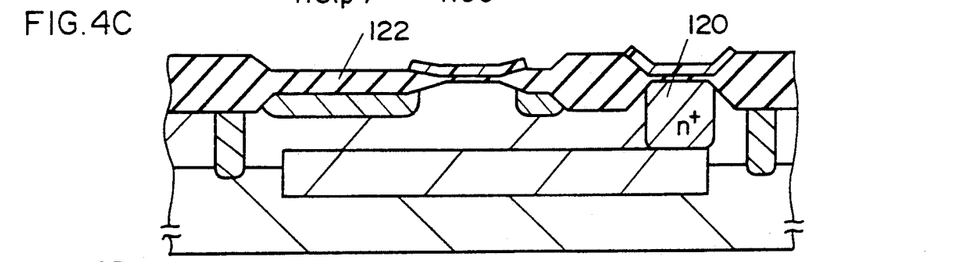
Figure 4D:
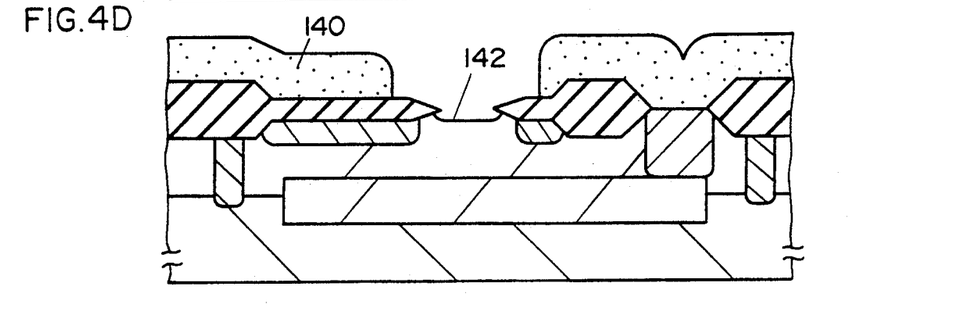
Figure 4E:
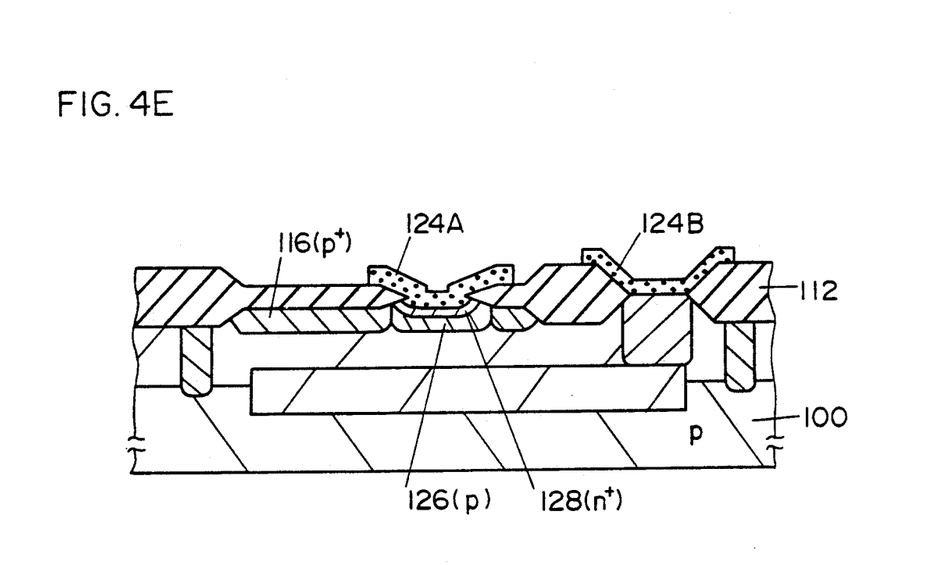
Figure 4F:
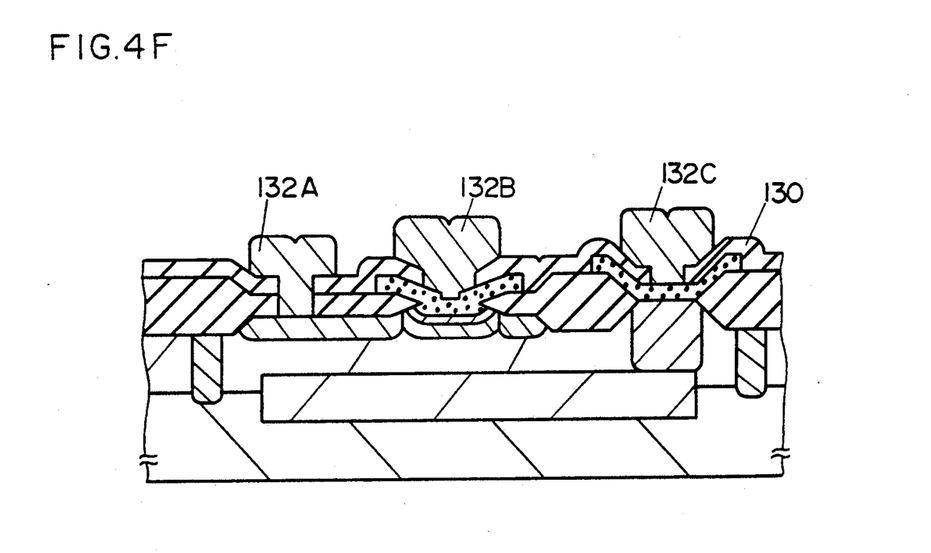
Figure 5A:
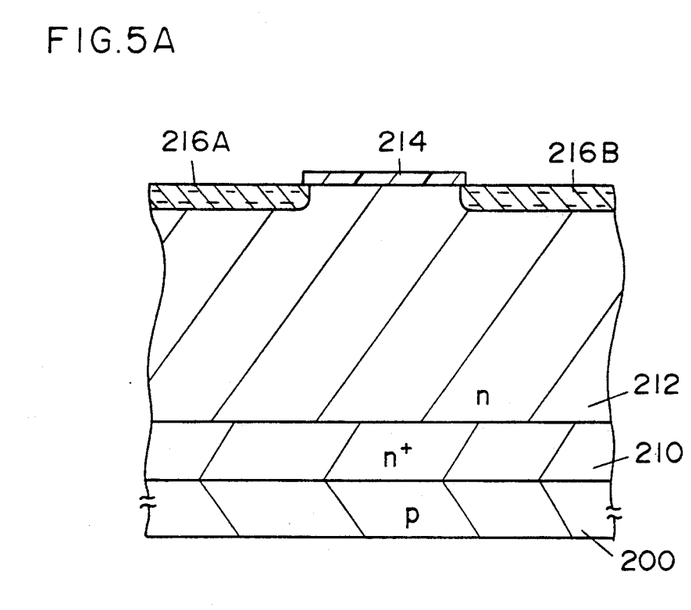
Figure 5B:
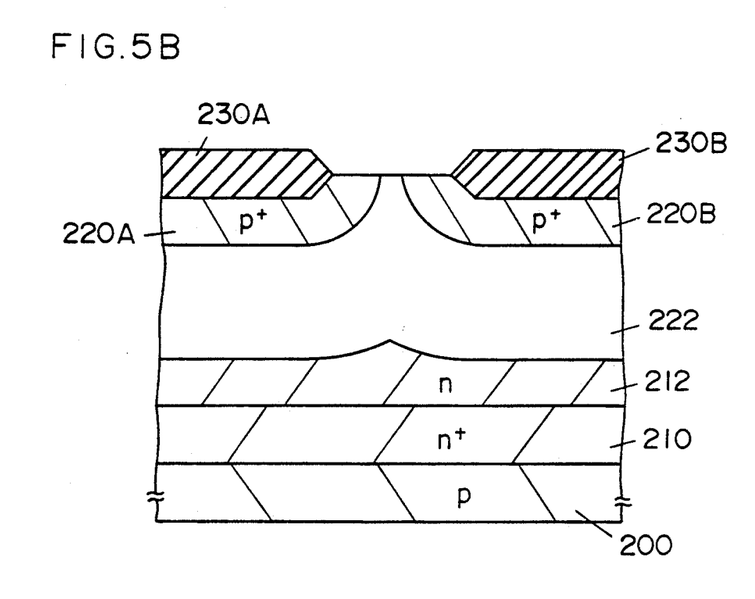
Figure 5C:
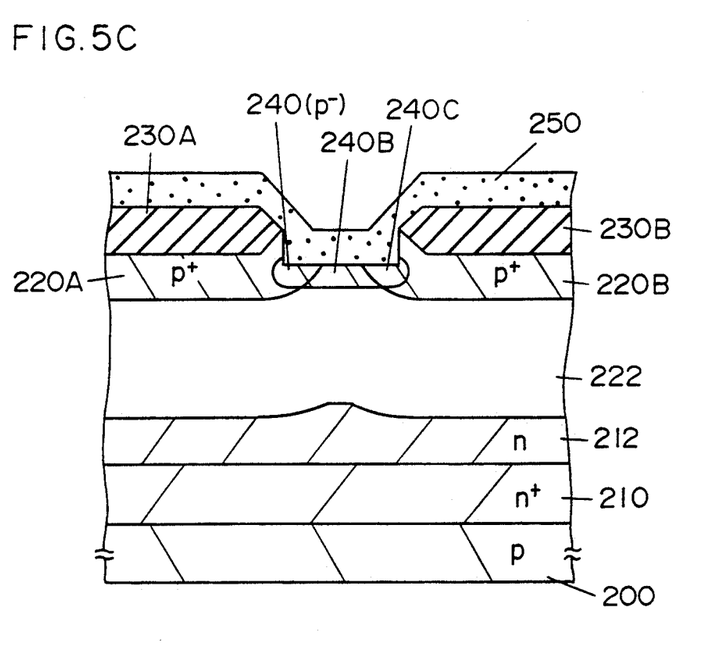
Figure 5D:
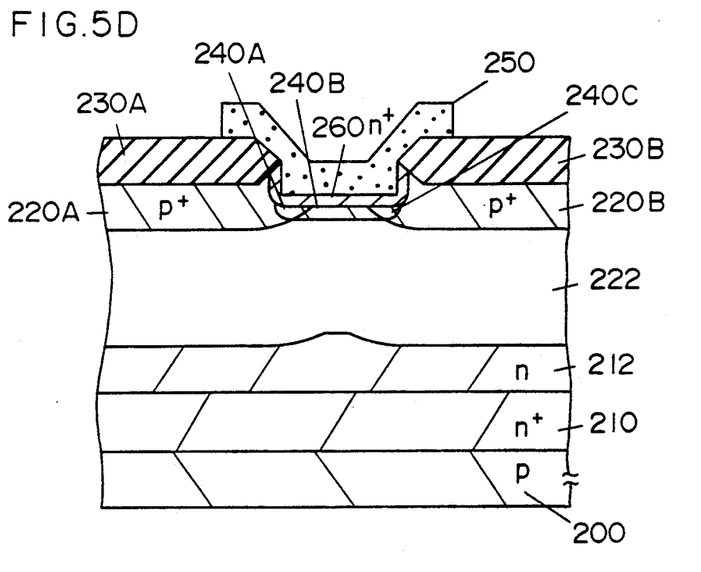
Figure 6A:
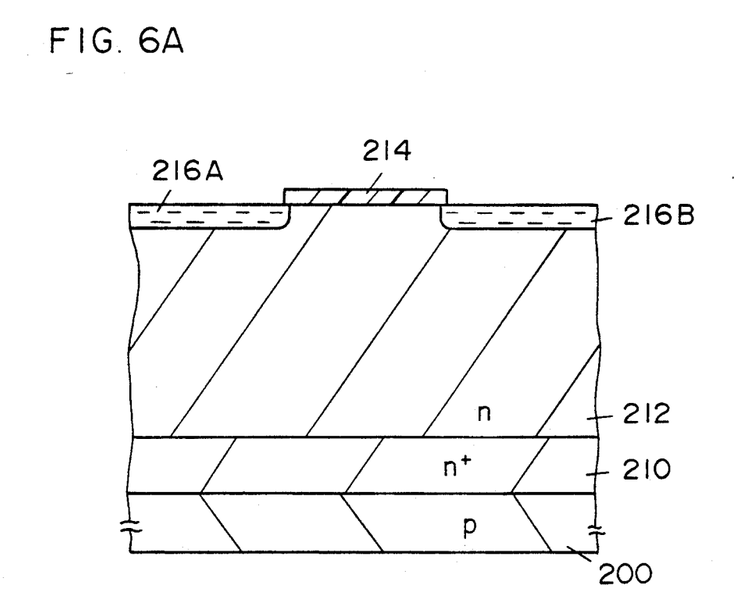
Figure 6B:
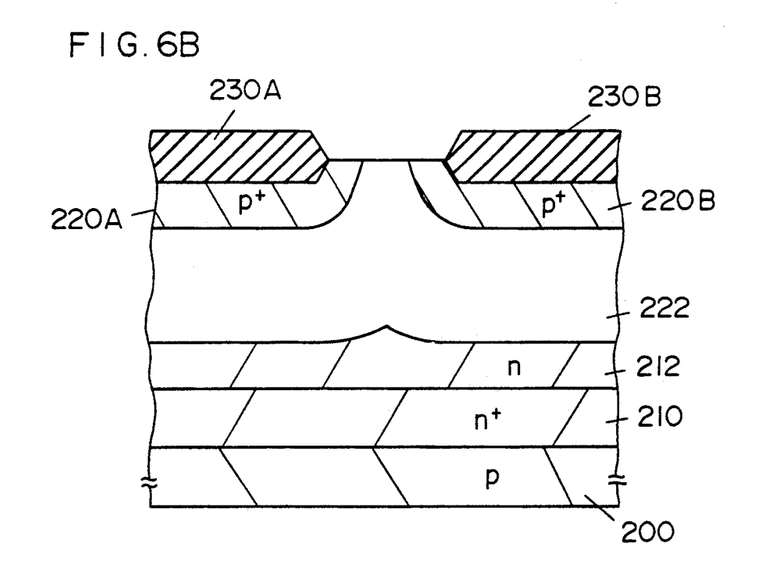
Figure 6C:
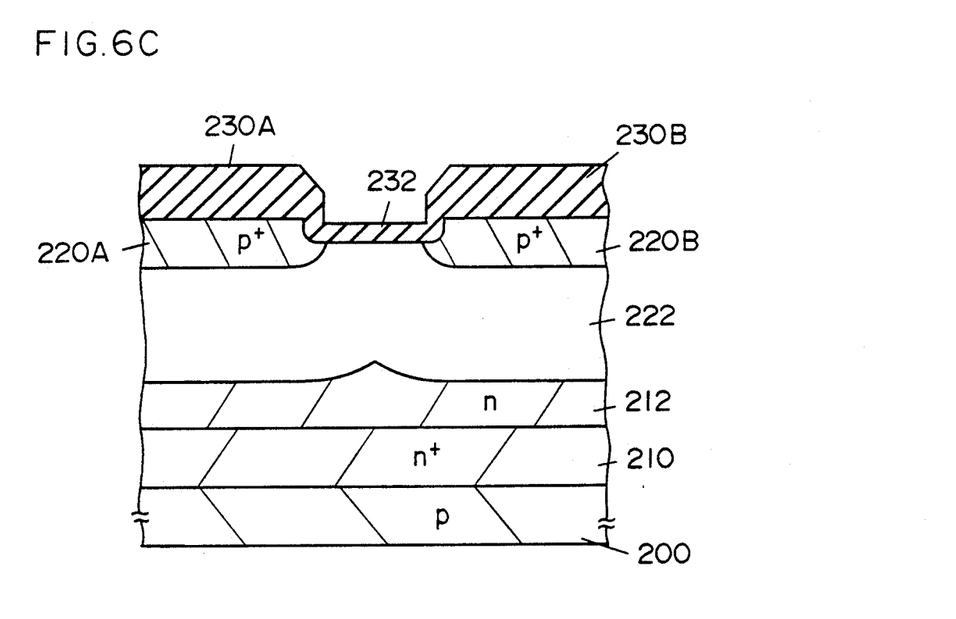
Figure 6D:
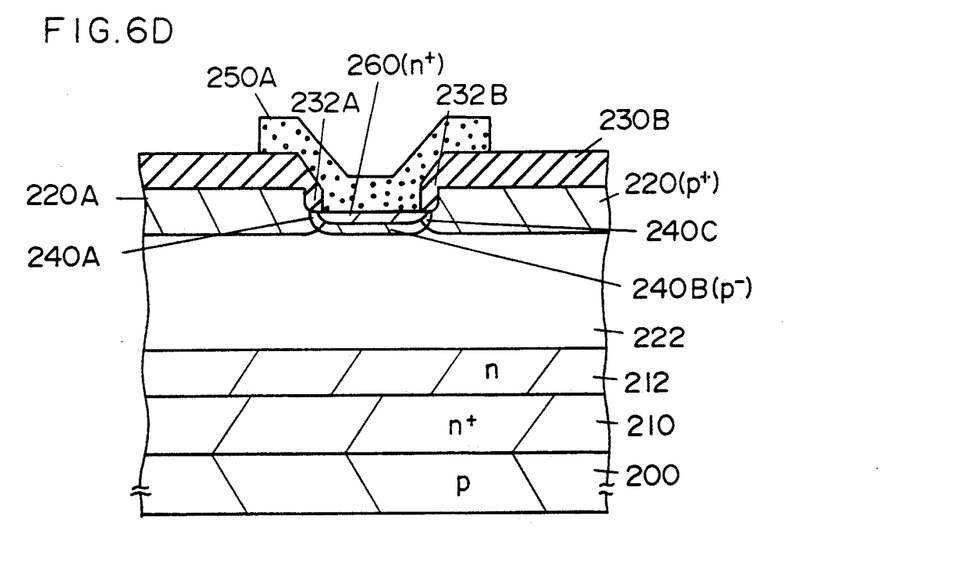

The transistor shown in FIG. 3 comprises P-type extrinsic base regions 220A, 220B formed around the device principal portion of an n-type semiconductor layer 212, in a depth of distance A from the principal plane of a substrate, a groove G formed in said device principal portion, in a depth of distance E from the principal plane of said substrate, P-type intrinsic base regions 240A, 240B formed side-wall oxide films 232A, 232B which are insulation films formed on the side of said groove G, at least in contact with said extrinsic base regions, in a depth of distance B from the bottom of said groove, and an n-type emitter formed within an insular region of said intrinsic base, wherein the sum of the depth E of groove G and depth B of intrinsic base regions 240A, 240B is so designed as not to exceed the depth A of extrinsic base regions 220A, 220B.

When this method of the invention as mentioned above was applied to the principal parts of the NPN transistor in FIG. 3, each element of the means produced the following actions.

(1) By forming the groove of depth E, the width X of the intrinsic base 240B could be extended to about 1.0 $\mu$, and the drive capacity of collector current could be increased.

(2) The length of the collector depletion layer 222 just beneath the intrinsic base 240 could be formed in about 1.0 $\mu$, being nearly equal to the length D of the depletion layer 222 just beneath the extrinsic bases 220A, 220B, and overgrowth of depletion layer was not caused.

(3) By keeping the sum of the depth E of groove G and depth B of the intrinsic base 240 to be smaller than or nearly equal to the depth A of extrinsic base 220, the development of depletion layer 222 up to the n-type buried layer 210 just beneath the intrinsic base 240B could be inhibited, so that deterioration of the breakdown voltage of the collector-base junction and an increase of the junction capacity could be prevented.

(4) By the insulation films 232A, 232B left over on the side of the groove G, the base-emitter junction region could be decreased, and the base current could be reduced. As a result, the current amplification factor could be enlarged and the base-emitter junction capacitance could be reduced.

(5) By the existence of insulation films 232A, 232B on the side of the groove, since the high concentration portion of p-type impurities on the extrinsic base surface and the high concentration portion of n-type impurities of the emitter do not directly contact each other, so that decrease of emitter-base junction breakdown voltage and increase of leakage current could be prevented.

(6) Due to the existence of the insulation films 232A, 232B on the side of the groove, the p-type impurity concentration of the extrinsic base could be increased, and the base resistance could be lowered.

The method of this invention was applied in the fabrication of a bipolar NPN transistor in a fourth embodiment shown in FIG. 4. This fourth embodiment is a method of fabricating the transistor of the first embodiment.

As shown in FIG. 4 A, after forming an N-type buried layer 102 on a P-type silicon semiconductor substrate 100, an N-type epitaxial semiconductor layer 104 was formed. After forming a P-type device separation region 106, thin thermal oxidation films 108A, 108B of about 20 nanometers in thickness were formed, and on this thermal oxidation films 108, silicon nitride films 110A, 110B in a thickness of about 100 nanometers were formed, and thermal oxidation was effected by using these silicon nitride films 110 as a mask, and a thick oxide film 112 of about 600 nanometers in thickness was formed.

As shown in FIG. 4 B, a photoresist pattern 114 was formed by photoetching, and using it as a mask, a silicon nitride film pattern 110C of about 1 micron in width was left over on the prospective portion for forming the emitter. Furthermore, using this photoresist pattern 114 as a mask, boron ions were implanted at a dose of $2\times10^{15}/cm^2$, and a p-type semiconductor region 116 was formed as an extrinsic base.

As shown in FIG. 4 C, after removing the photoresist pattern 114, phosphorus ions were implanted, and an N-type semiconductor region 120 was formed selectively, and thermal oxidation was effected by using an oxidation resistant silicon nitride film pattern 110C as a mask, and an oxide film 122 of about 200 nanometers in thickness was formed.

As shown in FIG. 4 D, removing the silicon nitride film pattern 110C and oxide film 108A, an opening for the emitter was formed, and a photoresist pattern 140 was formed, and a groove 142 was formed in the opening for emitter by using it as the mask.

As shown in FIG. 4 E, a polycrystalline silicon film was deposited on the entire surface, and by patterning it, polycrystalline silicon film patterns 124A, 124B were formed, and boron ions were implanted into this polycrystalline silicon film pattern 124A at a dose of $2\times10^{14}/cm^2$, and a P-type semiconductor region 126 as the intrinsic base was formed in a thickness of about 150 nanometers by heat treatment. Later, similarly, arsenic ions were implanted into this polycrystalline silicon film pattern 124A, and an N-type semiconductor region 128 as emitter was formed in a depth of about 50 nanometers by heat treatment.

As shown in FIG. 4 F, after depositing a silicon oxide film 130 on the entire surface, aluminum electrodes 132A, 132B, 132C, etc. were formed according to an ordinary fabricating method.

In this way, a vertical NPN transistor was formed by the method of this invention, and a structure of an active device portion (intrinsic base) having an excellent high speed operation with the base width of about 100 nanometers was obtained, and in addition since the extrinsic base and intrinsic base were favorably connected with each other by the formation of a groove, generation of leak current between collector and emitter could be prevented beneath the bird's beak shaped oxide film. Furthermore, by the formation of a groove, since the collector resistance was decreased, the switching characteristic was improved. Additionally, the unnecessary extrinsic base formed in the prospective portion to form the intrinsic base was removed, and favorable characteristics with few fluctuations of current amplification factor could be obtained.

FIG. 5 is a process sectional drawing to explain the fabricating method of a bipolar NPN transistor as a fifth embodiment of this invention. This fifth embodiment is a method of fabricating the transistor of the second embodiment.

As shown in FIG. 5 A, an n-type buried layer region 210 and an n-type epitaxial layer 212 of about 1 $\Omega$-cm were formed on a P-type semiconductor layer 200, and a silicon nitride film 214 of about 150 nanometers was deposited on the principal plane of this epitaxial layer, and this nitride film was patterned in a width of about 1.4 $\mu$ by photoetching, and to form an extrinsic base by using it as a mask, ion-implanted layers 216A, 216B were formed by implanting boron ions at high concentration.

As shown in FIG. 5 B, using said nitride film 214 as a mask, silicon oxide films ($SiO_2$) 230A, 230B of about 400 nanometers in thickness were formed by selective oxidation, and then this nitride film was removed. At this time, the depth of the P-type semiconductor regions 220A, 220B to become the extrinsic base was about 600 nanometers from the principal plane of the epitaxial layer substrate. At the same time, boron ions were also diffused in the lateral direction, and P-type regions 220A, 220B were formed also at the opening in about 1.0 $\mu$ in thickness formed by the oxide films 230A, 230B. Additionally, a depletion layer of about 1 $\mu$ was developed between the extrinsic base regions 220A, 220B and n-type epitaxial layer 212 which becomes a collector region.

As shown in FIG. 5 C, using the oxide films 230A, 230B as a mask, the exposed semiconductor epitaxial layer was subjected to an anisotropic etching process such as reactive ion etching, and a groove G of about 300 nanometers in depth was formed, and then by boron ion implantation and heat treatment, semiconductor regions 240A, 240B, 240C to become P-type intrinsic base were formed at a depth of about 200 nanometers, and an impurity-free polycrystalline silicon (polysilicon) 250 was deposited on the entire surface in a thickness of about 300 nanometers.

As shown in FIG. 5 D, arsenic ions were implanted at a high concentration into the polycrystalline silicon 250, and by heat treatment, an n-type region 260 in a depth of about 100 nanometers to become an emitter was formed from this polycrystalline silicon 250, and then the polycrystalline silicon 250 was patterned in a form of an electrode by photoetching.

In this series of manufacturing steps, the width in the depthwise direction of the base is about 100 nanometers, and the width of collector current passage is about 0.5 $\mu$, so that an NPN transistor structure excelling in both high speed operation and high integration design could be realized.

FIG. 6 A to D are process sectional drawings showing a series of manufacturing steps for the structure of the principal parts of a vertical NPN bipolar transistor as a sixth embodiment of this invention.

As shown in FIG. 6 A, an n-type buried layer region 210 and an n-type epitaxial layer 212 of about 1 $\mu$-cm were formed on a p-type semiconductor layer 200, and a silicon nitride film 214 of about 150 nanometers on the principal plane of this epitaxial layer were patterned in a width of about 1.5 $\mu$, and using it as a mask, boron ions were implanted at a high concentration to form an extrinsic base, and implantation layers 216A, 216B were formed.

As shown in FIG. 6 B, by selectively oxidizing using the nitride film 214 as a mask, silicon oxide films 230A, 230B of about 400 nanometers in thickness were formed, and this nitride film 214 was removed. At this time, the depth of the p-type semiconductor regions 220A, 220B to be the extrinsic base was about 600 nanometers from the principal plane of the epitaxial layer substrate 212. At the same time, boron ions were also diffused in the lateral direction, and p-type semiconductor regions 220A, 220B were also formed in the opening of the oxide films 230A, 230B in a width of about 1.0 $\mu$. At the same time, a depletion layer of about 1 $\mu$ was developed between the extrinsic base regions 220A, 220B and the n-type epitaxial layer 212 of collector region.

As shown in FIG. 6 C, using the oxide films 230A, 230B as a mask, the exposed semiconductor epitaxial layer was subjected to anisotropic etching such as reactive ion etching (RIE), and a groove of about 300 nanometers in depth was formed, and a silicon oxide film 232 was formed by thermal oxidation.

As shown in FIG. 6 D, by etching the silicon oxide film by anisotropic etching such as RIE, the bottom of the groove was exposed and the silicon oxide films 232A, 232B were left over on the side of the groove. In the exposed groove bottom, furthermore, p-type intrinsic bases 240A, 240B, 240C were formed by boron ion implantation and heat treatment, and arsenic or other n-type impurity ions were implanted into the polysilicon deposited in a thickness of about 300 nanometers, and an n-type semiconductor region 260 to become emitter was formed by heat treatment, and a polysilicon electrode 250A was formed by photoetching.

As a result of this series of steps, a p-type semiconductor region 240B of about 0.1 $\mu$ in width in the depth-wise direction of the base to become an intrinsic base, and an n-type semiconductor region 260 to become an emitter in a depth of about 0.1 $\mu$ were formed, and the area of emitter-base junction could be decreased by the silicon oxide films 232A, 232B on the side of the groove, so that the base current could be reduced and that the base-emitter junction capacitance could be decreased at the same time. Furthermore, since the high-concentration impurity region does not directly contact, the leak current of the emitter-base junction could be decreased, and the electrical breakdown voltage of the junction could be improved.

As a seventh embodiment of this invention, a series of manufacturing steps of NPN transistor is explained while referring to FIGS. 7A to 7D.

Figure 7A:
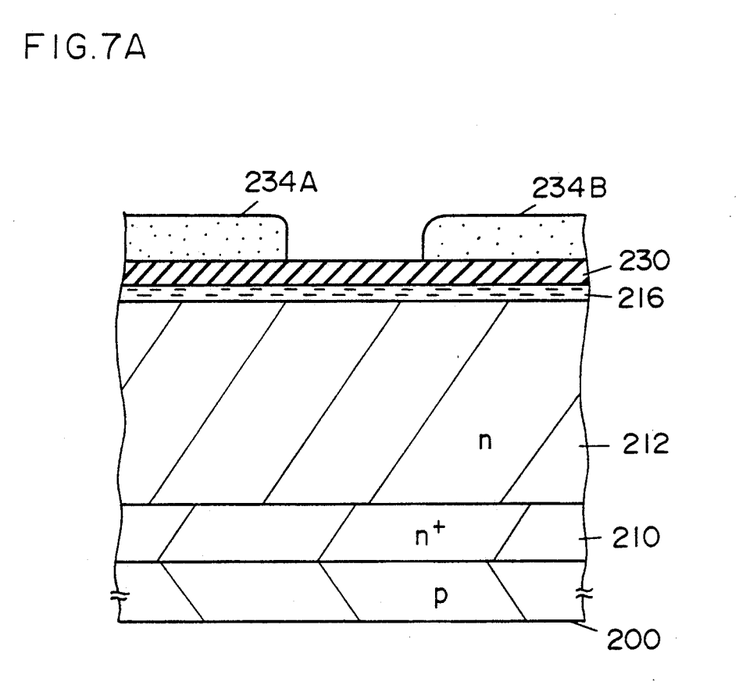

In the first place, as shown in FIG. 7A, an n-type buried layer region 210, an n-type epitaxial layer 212 of about 1 $\Omega$-cm and a thermal silicon oxide film 230 were formed on a p-type semiconductor layer 200, and by using this oxide film 230 as a mask, boron ions were implanted to form an ion implantation layer 216, and photoresist patterns 234A, 234B were left over around the prospective portion to form an intrinsic base, which is to be the principal portion of the NPN transistor, by photoetching.

Figure 7B:
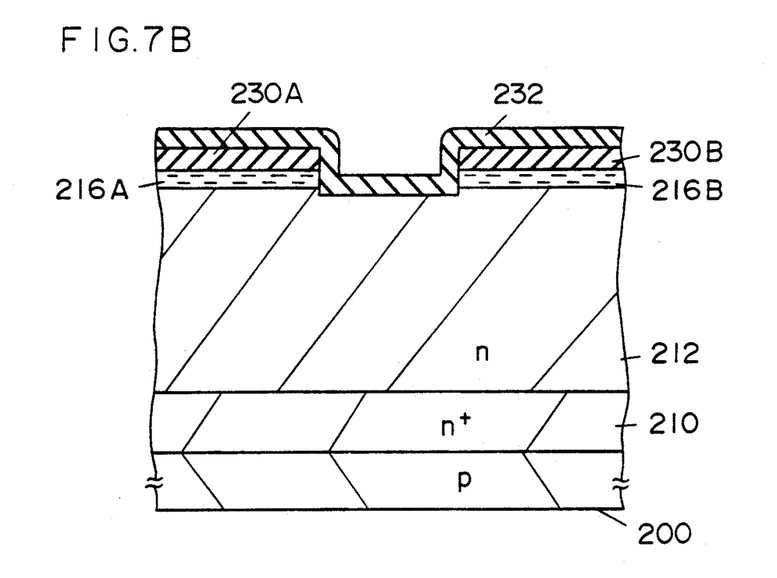

As shown in FIG. 7B, using the photoresist patterns 234A, 234B as masks, the silicon oxide film 230 and the silicon epitaxial layer 212 were subjected to anisotropic etching such as RIE, and a groove of depth of about 200 nanometers was formed, and after removing the photoresist patterns 234A, 234B, a silicon oxide film 232 of about 200 nanometers was deposited on the whole surface.

Figure 7C:
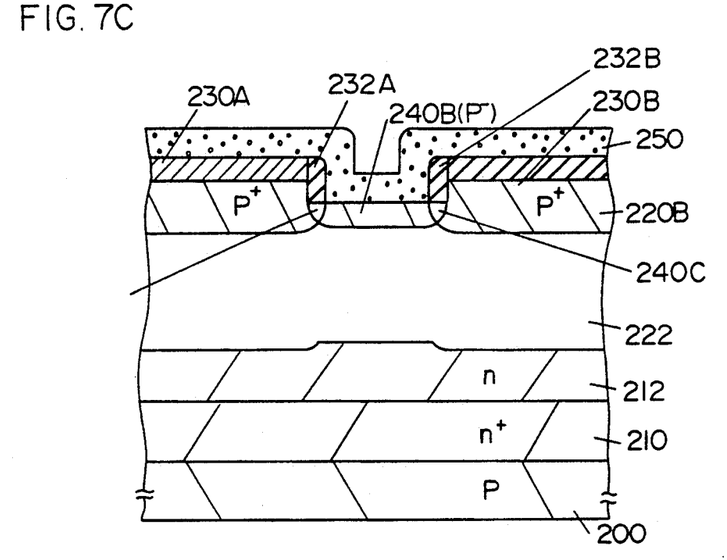

As shown in FIG. 7C, by anisotropic etching such as RIE, the silicon oxide film 232 was etched, and the oxide films 232A, 232B were left over on the side of the groove, and a polysilicon film 250 of about 300 nanometers was deposited on the whole surface, and boron or other p-type ions were implanted into this polysilicon film, and semiconductor regions 240A, 240B, 240C of about 0.2 $\mu$ in depth were formed, which are to become an intrinsic base, by heat treatment.

Figure 7D:
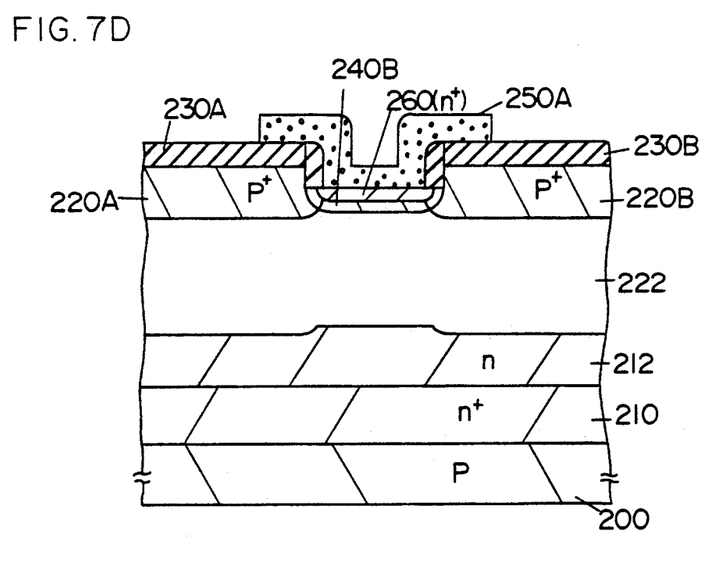

As shown in FIG. 7D, arsenic or other n-type impurity ions were implanted into the polysilicon film, and an n-type semiconductor region 260 to become an emitter of about 0.1 $\mu$ in depth was formed, and a polysilicon electrode 260A was formed by photoetching.

As a result of this series of steps, the p-type semiconductor region to become an extrinsic base could be formed more easily and at a lower resistance compared with the sixth embodiment of this invention. That is, before thermal diffusion of the extrinsic base, the groove and silicon oxide films 232A, 232B on its side could be formed, so that the impurity concentration of the extrinsic base could be sufficiently raised, and that the lateral diffusion of the p-type region of the extrinsic base could be reduced.

According to the method of this invention, meanwhile, assuming the emitter of bipolar device to be the gate and extrinsic bases at both sides of this device to be the source and drain, it can function as a junction type field effect transistor using the intrinsic base as the channel. Thus, the method of this invention may be applied to various semiconductor devices, not limited to the bipolar transistor.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What we claim is:

1. A method of fabricating a semiconductor device comprising:
   a step of forming an insulation film with an opening on a principal plane of an epitaxial semiconductor layer of a first type of conductivity;
   a step of forming a first semiconductor region of a second type of conductivity beneath said insulation film at a depth from said principal plane;
   a step of forming a groove at a depth from said principal plane by using said insulation film as an etching mask after forming said first semiconductor region;
   a step of forming a second semiconductor region of said second type of conductivity at a depth from a bottom of said groove by using said insulation film as a mask after forming said groove; and,
   a step of forming a third semiconductor region of said first type of conductivity in said second semiconductor region of said second type of conductivity by using said insulation film as a mask;
   wherein an unnecessary extrinsic region of said first semiconductor region in the prospective portion to form the intrinsic region of said second semiconductor region is removed by forming said groove.

2. A method of fabricating a semiconductor device comprising:
   a step of forming an insulation film with an opening on a principal plane of an epitaxial semiconductor layer of a first type of conductivity;
   a step of forming a first semiconductor region of a second type of conductivity beneath said insulation film at a depth from said principal plane;
   a step of forming a groove at a depth from said principal plane by using said insulation film as an etching mask after forming said first semiconductor region;
   a step of forming a second semiconductor region of said second type of conductivity at a depth from a bottom of said groove by using said insulation film as a mask after forming said groove; and,
   a step of forming a third semiconductor region of said first type of conductivity in said second semiconductor region of said second type of conductivity by using said insulation film as a mask;
   wherein said first semiconductor region and said second semiconductor region are physically connected to each other and a width of an intrinsic region of said second semiconductor region is defined by the second semiconductor region not canceled by a lateral diffusion of said first semiconductor region, and wherein the width of the intrinsic region is extended by forming said groove.

3. A method of fabricating a semiconductor device comprising:

a step of forming a first semiconductor region of a second type of conductivity at a depth from a principal plane of an epitaxial semiconductor layer of a first type of conductivity;

a step of forming an insulation film with an opening on said first semiconductor region;

a step of forming a groove at a depth from said principal plane by using said insulation film as an etching mask after forming said first semiconductor region, removing a part of said first semiconductor region in said opening by forming said groove;

a step of forming a second semiconductor region of said second type of conductivity at a depth from a bottom of said groove by using said insulation film as a mask after forming said groove; and, a step of forming a third semiconductor region of said first type of conductivity in said second semiconductor region of said second type of conductivity by using said insulation film as a mask.

4. A method of fabricating a bipolar semiconductor device comprising:

a step of forming an insulation film with an opening on a principal plane of an epitaxial semiconductor collector layer of a first type of conductivity;

a step of forming an extrinsic base region of a second type of conductivity beneath said insulation film at a depth from a principal plane;

a step of forming a groove at a depth from said principal plane by using said insulation film as an etching mask after forming said extrinsic base region, a step of forming an intrinsic base region of said second type of conductivity at a depth from a bottom of said groove by using said insulation film as a mask after forming said groove; and, a step of forming an emitter region of said first type of conductivity in said intrinsic base region of said second type of conductivity by using said insulation film as a mask;

wherein an unnecessary extrinsic region in the prospective portion to form the intrinsic bases region is removed by forming said groove.

5. A method of fabricating a bipolar semiconductor device comprising:

a step of forming an insulation film with an opening on a principal plane of an epitaxial semiconductor collector layer of a first type of conductivity;

a step of forming an extrinsic base region of a second type of conductivity beneath said insulation film at a depth from said principal plane;

a step of forming a groove at a depth from said principal plane by using said insulation film as an etching mask after forming said extrinsic base region;

a step of forming an intrinsic base region of said second type of conductivity at a depth from a bottom of said groove by using said insulation film as a mask after forming said groove; and, a step of forming an emitter region of said first type of conductivity in said intrinsic base region of said second type of conductivity by using said insulation film as a mask;

wherein said extrinsic base region and said intrinsic base region are physically connected to each other and a width of said intrinsic base region is defined by an intrinsic base region not canceled by a lateral diffusion of said extrinsic base region, and wherein the width of the intrinsic base region is extended by forming said groove.

6. A method of fabricating a bipolar semiconductor device comprising:

a step of forming an extrinsic base region of a second type of conductivity at a depth from a principle plane of an epitaxial semiconductor collector layer of a first type of conductivity;

a step of forming an insulation film with an opening on said extrinsic base region;

a step of forming a groove at a depth from said principal plane by using said insulation film as an etching mask after forming said extrinsic base region, removing a part of said extrinsic base region in said opening by forming said groove;

a step of forming an intrinsic base region of said second type of conductivity at a depth from a bottom of said groove by using said insulation film as a mask after forming said groove; and, a step of forming an emitter region of said first type of conductivity in said intrinsic base region by using said insulation film as a mask.

7. A method of fabricating a bipolar semiconductor device comprising:

a step of forming an extrinsic base region of a second type of conductivity at a depth from a principle plane of an epitaxial semiconductor collector layer of a first type of conductivity;

a step of forming an insulation film with an opening on said extrinsic base region;

a step of forming a groove at a depth from said principal plane by using said insulation film as an etching mask after forming said extrinsic base region, removing a part of said extrinsic base region in said opening by forming said groove;

a step of forming an intrinsic base region of said second type of conductivity at a depth from a bottom of said groove by using said insulation film as a mask after forming said groove; and, a step of forming an emitter region of said first type of conductivity in said intrinsic base region.

* * * * *